United States Patent
Kim et al.

(10) Patent No.: US 10,706,898 B2
(45) Date of Patent: Jul. 7, 2020

(54) SEMICONDUCTOR APPARATUS AND DATA PROCESSING SYSTEM

(71) Applicant: SK hynix Inc., Gyeonggi-do (KR)

(72) Inventors: Myoung Seo Kim, Gyeonggi-do (KR); Seung Yong Lee, Gyeonggi-do (KR); Young Pyo Joo, Seoul (KR)

(73) Assignee: SK hynix Inc., Gyeonggi-do (KR)

(*) Notice: Subject to any disclaimer, the term of this patent is extended or adjusted under 35 U.S.C. 154(b) by 0 days.

(21) Appl. No.: 16/352,173

(22) Filed: Mar. 13, 2019

(65) Prior Publication Data
US 2020/0035274 A1    Jan. 30, 2020

(30) Foreign Application Priority Data
Jul. 27, 2018   (KR) .................. 10-2018-0087520

(51) Int. Cl.
*G11C 7/00*    (2006.01)
*G11C 7/10*    (2006.01)

(52) U.S. Cl.
CPC .......... *G11C 7/1006* (2013.01); *G11C 7/1048* (2013.01)

(58) Field of Classification Search
CPC ...................... G11C 7/1006; G11C 7/1048
USPC ...................................... 365/189.11
See application file for complete search history.

(56) References Cited

U.S. PATENT DOCUMENTS

| | | | | |
|---|---|---|---|---|
| 5,705,938 A * | 1/1998 | Kean | ................ | H03K 19/17704 326/39 |
| 5,835,395 A | 11/1998 | Schreck et al. | | |
| 7,352,602 B2 * | 4/2008 | Janzen | ..................... | G11C 5/02 174/524 |
| 8,759,968 B2 | 6/2014 | Lee | | |
| 9,037,807 B2 * | 5/2015 | Vorbach | .............. | G06F 15/7867 711/147 |
| 9,471,484 B2 | 10/2016 | Oh et al. | | |
| 2002/0147898 A1 * | 10/2002 | Rentschler | .............. | G06F 12/04 711/170 |

FOREIGN PATENT DOCUMENTS

KR    101268099    5/2013

* cited by examiner

*Primary Examiner* — Vu A Le
(74) *Attorney, Agent, or Firm* — IP & T Group LLP

(57) ABSTRACT

A semiconductor apparatus may include: a pad unit including a plurality of pads; a memory cell array coupled to the pad unit through input/output signal lines; and a pad configuration control circuit configured to change a pad configuration of the pad unit by dividing the plurality of pads into a plurality of groups and setting the plurality of groups to different modes, respectively.

20 Claims, 6 Drawing Sheets

SEMICONDUCTOR APPARATUS AND DATA PROCESSING SYSTEM

CROSS-REFERENCES TO RELATED APPLICATION

The present application claims priority under 35 U.S.C. § 119(a) to Korean application number 10-2018-0087520, filed on Jul. 27, 2018, in the Korean Intellectual Property Office, which is incorporated herein by reference in its entirety.

BACKGROUND

1. Technical Field

Various embodiments generally relate to a semiconductor circuit, and more particularly, to a semiconductor apparatus capable of changing operation modes of signal input/output pads and a data processing system.

2. Related Art

A semiconductor apparatus includes a plurality of pads for outputting signals to an external device or receiving signals provided from the external device.

The plurality of pads may include pads for inputting and outputting data, addresses, commands or/and separate dedicated signals.

The plurality of pads may be one-to-one coupled to pins outside the semiconductor apparatus.

A wide input and output (I/O) semiconductor apparatus includes a larger number of pads than a general semiconductor apparatus. The wide I/O semiconductor apparatus requires an efficient pad configuration suitable for the purpose thereof. Furthermore, the wide I/O semiconductor apparatus requires a large amount of power to drive a large number of pads.

Thus, the plurality of pads of a semiconductor apparatus need to be efficiently controlled.

SUMMARY

Various embodiments are directed to a semiconductor apparatus capable of implementing an efficient pad configuration suitable for the purpose thereof, and a data processing system including the same.

In an embodiment, a semiconductor apparatus may include: a pad unit including a plurality of pads; a memory cell array coupled to the pad unit through input/output signal lines; and a pad configuration control circuit configured to change a pad configuration of the pad unit by dividing the plurality of pads into a plurality of groups and setting the plurality of groups to different modes, respectively.

In an embodiment, a semiconductor apparatus may include: a pad unit including a plurality of pads; write and read paths coupled to the pad unit in common through first input/output signal lines; a core block including a memory cell array, and coupled to the write and read paths in common through second input/output signal lines; and first and second switches coupled in parallel to each of the first input/output signal lines, wherein the first switch opens or closes a signal path from the pad unit to the write path according to any one bit of signal bits of a pad configuration control signal, and the second switch opens or closes a signal path from the read path to the pad unit according to another bit of the signal bits of the pad configuration control signal.

In an embodiment, a data processing system may include: a host configured to generate source signals according to a characteristic of an application corresponding to a user request and an application change frequency; and a semiconductor memory including a pad unit composed of a plurality of pads, and configured to change a pad configuration of the pad unit by dividing the plurality of pads into a plurality of groups according to the source signals and setting the plurality of groups to different modes.

DETAILED DESCRIPTION

Hereinafter, a semiconductor apparatus and a data processing system according to the present disclosure will be described below with reference to the accompanying drawings through exemplary embodiments.

Figure 1:
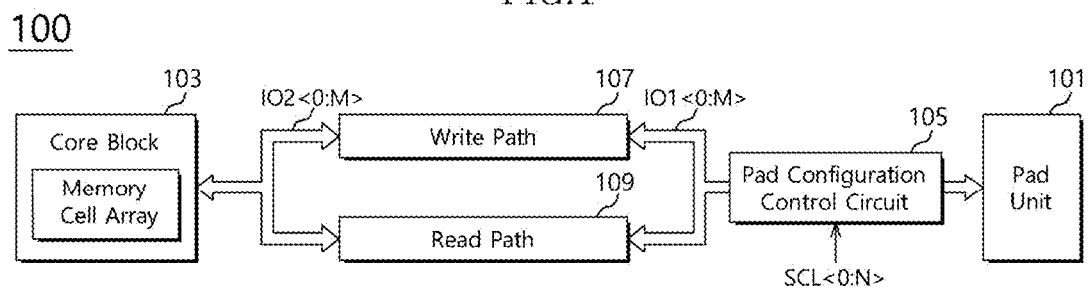
FIG. 1 illustrates a semiconductor apparatus in accordance with an embodiment.

FIG. 1 illustrates a semiconductor apparatus 100 in accordance with an embodiment.

Referring to FIG. 1, the semiconductor apparatus 100 may include a pad unit 101, a core block 103, a pad configuration control circuit 105, a write path 107 and a read path 109.

The pad unit 101 may be coupled to the write path 107 and the read path 109 in common through first input and output (input/output) signal lines IO1<0:M>.

The core block 103 may be coupled to the write path 107 and the read path 109 in common through second input/output signal lines IO2<0:M>.

The pad unit 101 may include at least one of a plurality of pads. The plurality of pads may include data pads for inputting/outputting data, address pads for inputting addresses, command pads for inputting commands, and separate dedicated pads for inputting/outputting dedicated signals.

The core block 103 may include a memory cell array and components for sensing and amplifying data from the memory cell array, outputting the data to the second input/output signal lines IO02<0:M> and inputting data from the second input/output signal lines IO02<0:M>.

During a read operation, the core block 103 may output data written in the memory cell array to the pad unit 101 via the second input/output signal lines IO02<0:M>, the read path 109 and the first input/output signal lines IO1<0:M>.

During a write operation, the core block 103 may write data inputted through the pad unit 101 to the memory cell array via the first input/output signal lines IO1<0:M>, the write path 107 and the second input/output signal lines IO2<0:M>.

The pad configuration control circuit 105 may change the pad configuration of the plurality of pads (for example, data pads) according to pad configuration control signals SCL<0:N>.

The pad configuration control circuit 105 may set the entire pads (for example, the entire data pads) to any one of a plurality of modes. Further, the pad configuration control circuit 105 may divide the data pads into groups and set the groups to different modes among the plurality of modes.

The plurality of modes may include an input/output-combined mode, an input-dedicated mode, an output-dedicated mode or an input/output blocking mode.

In various embodiments, the pad configuration control signals SCL<0:N> may have independent values. Therefore, the positions of the groups set by dividing the data pads and the size of each group (or the number of pads included in the group) may be changed according to the pad configuration control signals SCL<0:N>.

The pad configuration control circuit 105 may change the pad configuration of the pad unit 101 by independently controlling input/output paths coupled to the pad unit 101 according to the pad configuration control signals SCL<0:N>.

Figure 2:
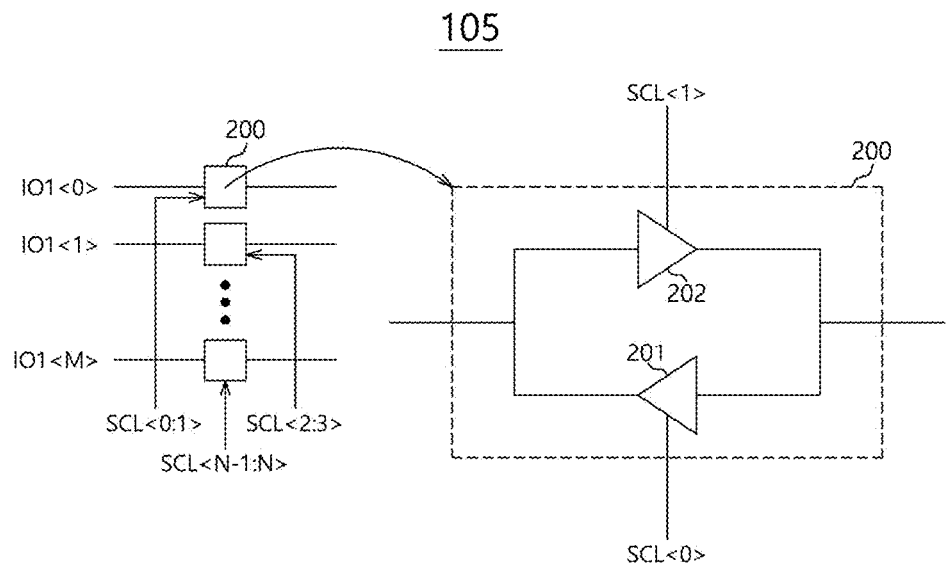
FIG. 2 illustrates a pad configuration control circuit in accordance with an embodiment.

FIG. 2 illustrates a pad configuration control circuit in accordance with an embodiment, for example, the pad configuration control circuit 105 of FIG. 1.

Referring to FIG. 2, the pad configuration control circuit 105 may include a plurality of pad configuration control units 200.

The plurality of pad configuration control units 200 may be configured in the same manner.

The plurality of pad configuration control units 200 may be respectively coupled to paths coupled to the pad unit 101, i.e., the first input/output signal lines IO1<0:M>.

The plurality of pad configuration control units 200 may be one-to-one coupled to the first input/output signal lines IO1<0:M>.

Each of the pad configuration control units 200 may include a plurality of switches coupled in parallel to the corresponding first input/output signal line of the first input/output signal lines IO1<0:M>. For example, the plurality of switches includes first and second pass gates 201 and 202.

The first pass gate 201 may be coupled to any one of the first input/output signal lines IO1<0:M>, for example, the first input/output signal line IO1<0>. The first pass gate 201 may open or close an input path of the first input/output signal line IO1<0> of the first input/output signal lines IO1<0:M> according to the pad configuration control signal SCL<0> of the pad configuration control signals SCL<0:N>.

The input path may indicate a signal input path from the pad unit 101 to the write path 107.

The second pass gate 202 may be coupled to the first input/output signal line IO1<0> of the first input/output signal lines IO1<0:M>. The second pass gate 202 may open or close an output path of the first input/output signal line IO1<0> of the first input/output signal lines IO1<0:M> according to the pad configuration control signal SCL<1> of the pad configuration control signals SCL<0:N>.

The output path may indicate a signal output path from the read path 109 to the pad unit 101.

Referring again to FIG. 1, the semiconductor apparatus 100 may include a pad configuration control signal generation circuit for generating the pad configuration control signals SCL<0:N>.

Figure 3:
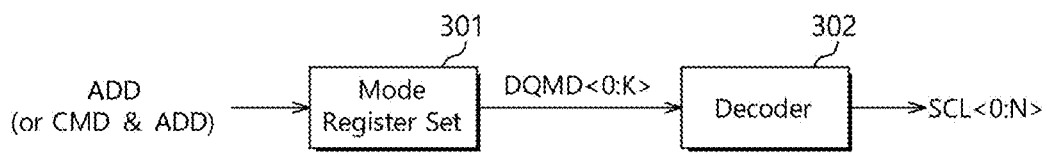
FIG. 3 illustrates a pad configuration control signal generation circuit in accordance with the present embodiment.

FIG. 3 illustrates a pad configuration control signal generation circuit 300 in accordance with the present embodiment.

The pad configuration control signal generation circuit 300 may be included in the core block 103 of FIG. 1. Although the pad configuration control signal generation circuit 300 may be included in the core block 103 as an example, the arrangement region of the pad configuration control signal generation circuit is not limited thereto. Alternatively, the pad configuration control signal generation circuit may be positioned in an appropriate region considering signal lines, among the entire regions of the semiconductor apparatus 100.

Referring to FIG. 3, the pad configuration control signal generation circuit 300 may receive source signals for generating the pad configuration control signals SCL<0:N>, through the address pads ADD (or address and command pads CMD & ADD) of the pad unit 101.

The pad configuration control signal generation circuit 300 may include a mode register set 301 and a decoder 302.

The mode register set 301 may receive the source signals through the address pads (or the address and command pads), and generate preliminary signals DQMD<0:K>.

An external device may be coupled to the semiconductor apparatus 100. For example, a host such as a memory controller may be coupled to the semiconductor apparatus 100. The external device may change the value of the preliminary signals DQMD<0:K> using the source signals, according to the purpose of the semiconductor apparatus 100.

The decoder 302 may generate the pad configuration control signals SCL<0:N> by decoding the preliminary signals DQMD<0:K>.

Figure 4:
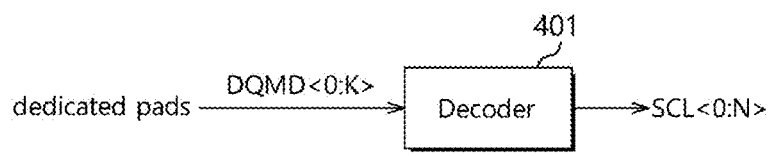
FIG. 4 illustrates a pad configuration control signal generation circuit in accordance with the present embodiment.

FIG. 4 illustrates a pad configuration control signal generation circuit 400 in accordance with the present embodiment.

Referring to FIG. 4, the pad configuration control signal generation circuit 400 may receive the source signals for generating the pad configuration control signals SCL<0:N> through one or more dedicated pads. For example, the pad configuration control signal generation circuit 400 receives the preliminary signals DQMD<0:K> through the dedicated pads. The dedicated pads may be used only to input the source signals, among the pads of the pad unit 101.

The pad configuration control signal generation circuit 400 may include a decoder 401.

The decoder 401 may decode the preliminary signals DQMD<0:K> and generate the pad configuration control signals SCL<0:N>.

FIGS. 5A to 5D illustrate examples of a pad configuration of a semiconductor apparatus in accordance with the present embodiment, for example the semiconductor apparatus of FIG. 1.

Figure 5A:
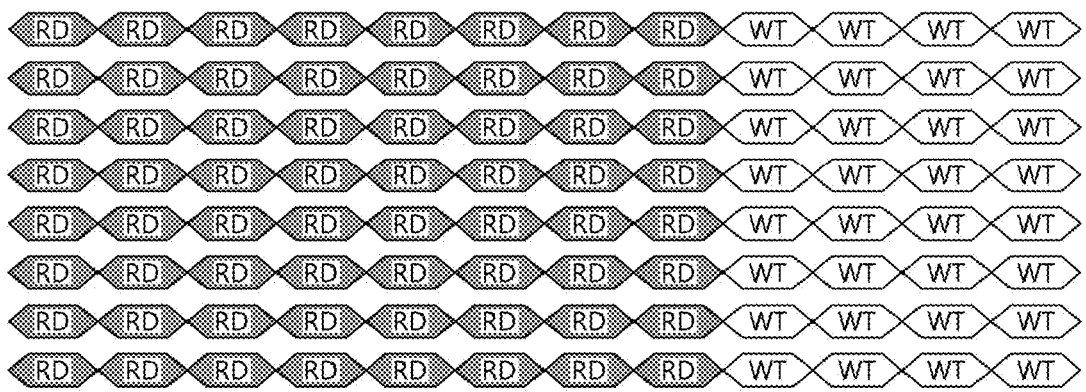
FIGS. 5A to 5D illustrate examples of a pad configuration of a semiconductor apparatus in accordance with the present embodiment.

FIG. 5A illustrates that, for 96 data pads of the pad unit 101, the ratio of output to input (RD:WT) is set to 2:1.

The 96 data pads may have a basic structure capable of inputting/outputting data.

In the present embodiment, among the 96 data pads, 64 data pads may be set to an output-dedicated mode RD, and the other data pads may be set to an input-dedicated mode WT, according to the pad configuration control signals SCL<0:N>.

Figure 5B:
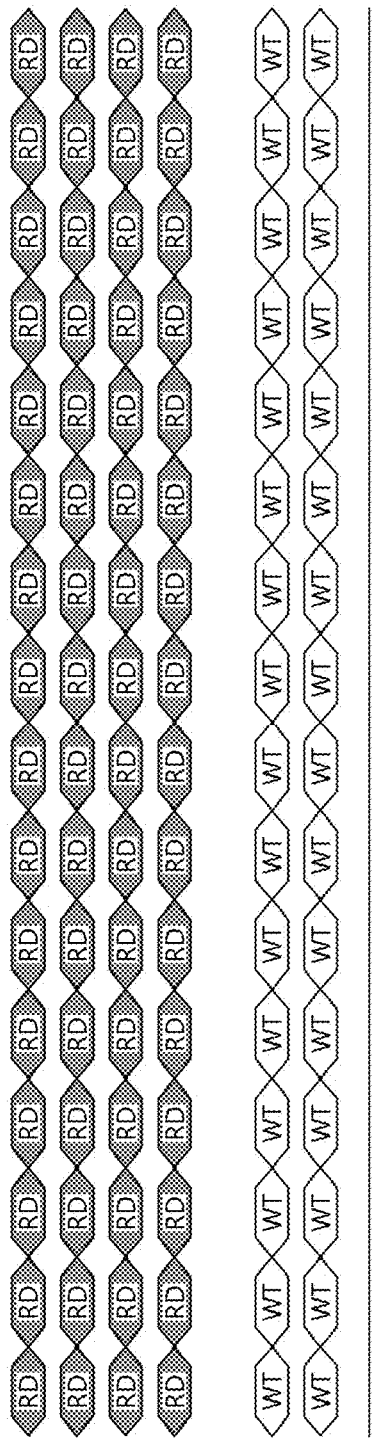

FIG. 5B illustrates that some data pads (e.g., 96 data pads) of 128 data pads of the pad unit 101 are set to the input/output dedicated modes, while the other data pads (e.g., 32 data pads) are set to the input/output blocking mode. The ratio of output to input (RD:WT) for some data pads (e.g., 96 data pads) is set to 2:1.

The 128 data pads may have a basic structure capable of inputting/outputting data.

In the present embodiment, among the 128 data pads, 64 data pads may be set to the output-dedicated mode RD, 32 data pads may be set to input-dedicated mode WT, and the other 32 data pads may be set to the input/output blocking mode, according to the pad configuration control signals SCL<0:N>.

Figure 5C:
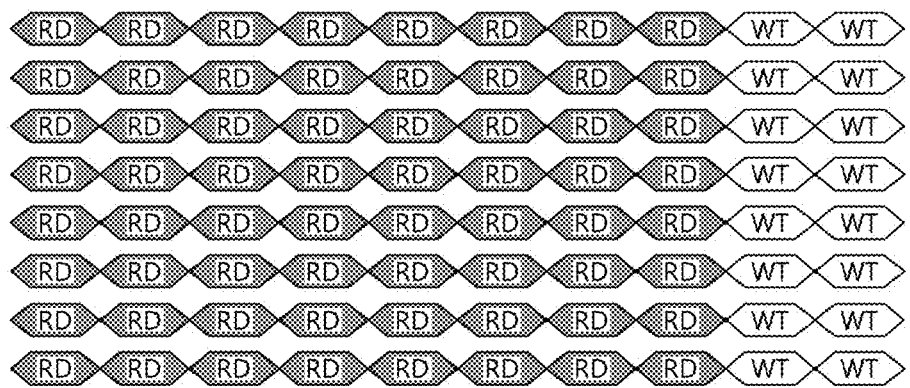

FIG. 5C illustrates that, for 80 data pads of the pad unit 101, the ratio of output to input (RD:WT) is set to 4:1.

The 80 data pads may have a basic structure capable of inputting/outputting data.

In the present embodiment, among the 80 data pads, 64 data pads may be set to the output-dedicated mode RD, and the other 16 data pads may be set to the input-dedicated mode WT, according to the pad configuration control signals SCL<0:N>.

Figure 5D:
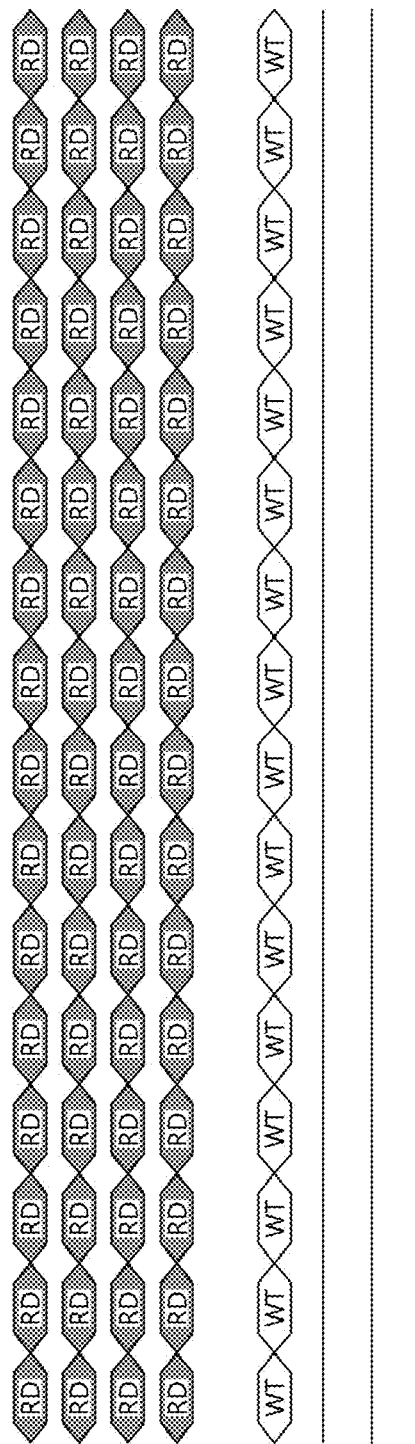

FIG. 5D illustrates that some data pads (e.g., 80 data pads) of 128 data pads of the pad unit 101 are set to the input/output dedicated modes, the other data pads (e.g., 48 data pads) are set to the input/output blocking mode. The ratio of output to input (RD:WT) for some data pads (e.g., 80 data pads) is set to 4:1.

The 128 data pads may have a basic structure capable of inputting/outputting data.

In the present embodiment, among the 128 data pads, 64 data pads may be set to the output-dedicated mode RD, 16 data pads may be set to the input-dedicated mode WT, and the other 48 data pads may be set to the input/output blocking mode, according to the pad configuration control signals SCL<0:N>.

FIGS. 5A to 5D only illustrate examples of the pad configuration, and the semiconductor apparatus 100 in accordance with the present embodiment may change and control the pad configuration in various manners in addition to the above-described examples, according to the pad configuration control signals SCL<0:N>. Furthermore, the pad configuration may be changed any time under external control.

Therefore, the pad configuration may be changed according to the purpose of the semiconductor apparatus 100, and operations of unnecessary pads may be blocked to reduce the power consumption.

Figure 6:
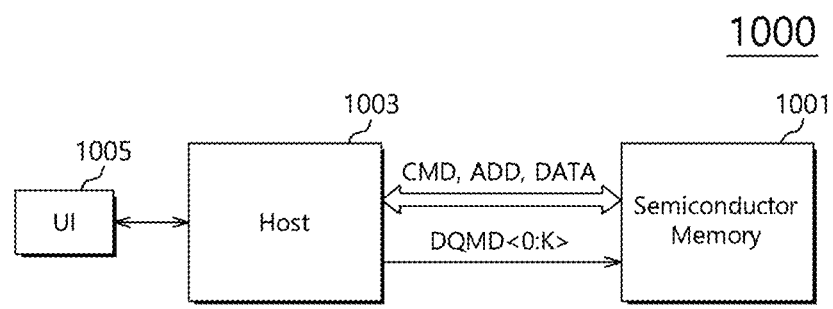
FIG. 6 illustrates a data processing system in accordance with an embodiment.

FIG. 6 illustrates a data processing system 1000 in accordance with an embodiment.

Referring to FIG. 6, the data processing system 1000 may include a semiconductor memory 1001, a host 1003 and a user interface (UI) 1005.

The semiconductor memory 1001 may be configured as a single memory chip. Alternatively, the semiconductor memory 1001 may be configured as a memory module having a three-dimensional (3D) structure in which a plurality of memory chips is stacked.

The semiconductor memory 1001 may have the same configuration as the semiconductor apparatus 100 described with reference to FIGS. 1 to 5D, and perform the same operation as the semiconductor apparatus 100.

The semiconductor memory 1001 may change the pad configuration of the pad unit according to source signals provided to from an external device of the semiconductor apparatus, that is, the host 1003.

The semiconductor memory 1001 may receive the source signals through the address pads, or receive the preliminary signals DQMD<0:K> through dedicated pads which are used only to receive the source signals.

The user interface 1005 may include various interfaces such as a keyboard, a mouse, a monitor and a touch screen, which may receive a user input and output information based on the user input.

The host 1003 may include a memory controller for controlling the semiconductor memory 1001, for example, a system on chip (SoC).

The host 1003 may control signal input and output of the semiconductor memory 1001 or/and signal input and output of the user interface 1005.

The host 1003 may change the pad configuration of the pad unit of the semiconductor memory 1001 by adjusting the value of the source signals or the preliminary signals DQMD<0:K> according to an application characteristic and application change frequency.

A plurality of applications may be installed in the host 1003 or the semiconductor memory 1001.

The host 1003 may change the pad configuration of the pad unit by dividing the plurality of applications into first and second types and adjusting the value of the source signals according to the type of an application to be executed.

The first type of applications may include applications related to Artificial Intelligence (AI) and Augmented Reality (AR), and perform real-time processing during an image processing process as a main function. The second type of applications may include general applications other than the image processing applications.

The host 1003 may analyze a user request through the user interface 1005, and determine whether the application to be executed is the first or second type.

When the application corresponding to the user request is the second type, the host 1003 may adjust the value of the source signals to set a part of all the data pads of the pad unit of the semiconductor memory 1001 to the output-dedicated mode RD and to set the other part or another part of the data pads to the input-dedicated mode WT.

At this time, the ratio of output to input (RD:WT) in the pad unit may be set to 2:1 or 4:1 as illustrated in FIGS. 5A to 5D, according to the application to be executed.

When the application corresponding to the user request is the first type, the host 1003 may adjust the value of the source signals to set all of the data pads of the pad unit of the semiconductor memory 1001 to the output-dedicated mode RD or the input-dedicated mode WT.

When the application corresponding to the user request is the first type, the host 1003 may adjust the value of the source signals to set a part of the data pads of the pad unit of the semiconductor memory 1001 to the output-dedicated mode RD or the input-dedicated mode WT.

The host 1003 may adjust the value of the source signals to set unused data pads of the data pads of the pad unit to the input/output blocking mode.

When the change frequency between the types of the applications is greater than or equal to a preset count, that is, when applications corresponding to different types needs to be alternately executed a preset number of times or more within a fixed time, the host 1003 may adjust the value of the source signals to set the pad configuration of the pad unit to a configuration suitable for the second type, regardless of the types of the applications.

While various embodiments have been described above, it will be understood to those skilled in the art that the embodiments described are examples only. Accordingly, the operating method of a data storage device described herein should not be limited based on the described embodiments.

What is claimed is:
1. A semiconductor apparatus comprising:
a pad unit comprising a plurality of pads;
a memory cell array coupled to the pad unit through input and output (input/output) signal lines; and
a pad configuration control circuit configured to change a pad configuration of the pad unit by dividing the plurality of pads into groups and setting the groups to different modes, respectively.

2. The semiconductor apparatus according to claim 1, wherein the pad configuration control circuit changes the pad configuration of the pad unit by independently controlling input/output paths of the input/output signal lines according to a pad configuration control signal, which is generated through source signals inputted from an external device.

3. The semiconductor apparatus according to claim 1, wherein the plurality of pads comprises one or more of address pads, command pads and dedicated pads used only to input source signals.

4. The semiconductor apparatus according to claim 1, wherein one or more of the groups are set to one or more of an input/output-combined mode, an input-dedicated mode, an output-dedicated mode and an input/output blocking mode.

5. The semiconductor apparatus according to claim 1, wherein the pad configuration control circuit comprises a plurality of switches coupled in parallel to each of the input/output signal lines.

6. The semiconductor apparatus according to claim 1, further comprising a pad configuration control signal generation circuit configured to receive source signals from an external device through address pads of the pad unit, and generate the pad configuration control signal using the source signals.

7. The semiconductor apparatus according to claim 6, wherein the pad configuration control signal generation circuit comprises:
a mode register set configured to receive the source signals and generate a preliminary signal; and
a decoder configured to generate the pad configuration control signal by decoding the preliminary signal.

8. The semiconductor apparatus according to claim 1, further comprising a decoder configured to receive source signals from an external device through dedicated pads of the pad unit, which are used only to input the source signals, and generate the pad configuration control signal.

9. A semiconductor apparatus comprising:
a pad unit comprising a plurality of pads;
write and read paths coupled to the pad unit in common through first input and output (input/output) signal lines;
a core block comprising a memory cell array, and coupled to the write and read paths through second input/output signal lines; and
first and second switches coupled in parallel to each of the first input/output signal lines,
wherein the first switch selectively couples a signal path from the pad unit to the write path according to a pad configuration control signal, and the second switch selectively couples a signal path from the read path to the pad unit according to the pad configuration control signal.

10. The semiconductor apparatus according to claim 9, further comprising:
a mode register set configured to receive source signals from an external device through address pads of the pad unit, and generate a preliminary signal using the source signals; and
a decoder configured to generate the pad configuration control signal by decoding the preliminary signal.

11. The semiconductor apparatus according to claim 9, further comprising a decoder configured to receive source signals from an external device through dedicated pads of the pad unit, which are used only to input the source signals, and generate the pad configuration control signal using the source signals.

12. A data processing system comprising:
a host configured to generate source signals according to a characteristic of an application corresponding to a user request and an application change frequency; and
a semiconductor memory comprising a pad unit including a plurality of pads, and configured to change a pad configuration of the pad unit by dividing the plurality of pads into one or more groups according to the source signals and setting the one or more groups to different modes.

13. The data processing system according to claim 12, wherein the semiconductor memory comprises:
a memory cell array coupled to the pad unit through input and output (input/output) signal lines; and
a pad configuration control circuit configured to change the pad configuration of the pad unit according to a pad configuration control signal generated through the source signals.

14. The data processing system according to claim 13, further comprising:
a mode register set configured to generate a preliminary signal using the source signals; and
a decoder configured to generate the pad configuration control signal by decoding the preliminary signal.

15. The data processing system according to claim 12, wherein the plurality of pads comprises one or more of address pads, command pads and dedicated pads used only to input the source signals.

16. The data processing system according to claim 12, wherein the one or more groups are set to one or more of an input/output-combined mode, an input-dedicated mode, an output-dedicated mode and an input/output blocking mode.

17. The data processing system according to claim 12, wherein the host divides a plurality of applications installed therein into a first type related to image processing applications and a second type related to the other applications and generates the source signals according to the type of an application to be executed.

18. The data processing system according to claim 17, wherein the host analyzes a user request inputted through a user interface and determines whether the application to be executed is the first or second type.

19. The data processing system according to claim 17, wherein the host generates the source signals for setting a part of all the pads of the pad unit to an output-dedicated mode and setting other part or rest of the pads to an input-dedicated mode when an application corresponding to a user request is the second type, generates the source signals for setting all the pads of the pad unit to the output-dedicated mode or the input-dedicated mode when the application corresponding to the user request is the first type, and generates the source signals for setting unused pads of the pad unit an input/output blocking mode.

20. The data processing system according to claim 17, wherein, when the frequency at which different types of applications are changed is greater than or equal to a preset count, the host generates the source signals for setting a part of all the pads of the pad unit to an output-dedicated mode and setting other part or rest of the pads to an input-dedicated mode, regardless of the type of an application.

* * * * *